(12) United States Patent
Kang

(10) Patent No.: US 6,258,645 B1
(45) Date of Patent: Jul. 10, 2001

(54) HALO STRUCTURE FOR CMOS TRANSISTORS AND METHOD OF MANUFACTURING THE SAME

(75) Inventor: Woo Tag Kang, Sungnam (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/482,394

(22) Filed: Jan. 12, 2000

(30) Foreign Application Priority Data

Apr. 23, 1999 (KR) .................................................. 99-14572

(51) Int. Cl.[7] .............................................. H01L 21/8238
(52) U.S. Cl. .......................... 438/224; 438/231; 438/291; 438/307
(58) Field of Search ..................................... 438/199, 216, 438/217, 223, 224, 230, 231, 301, 303, 306, 307, 291

(56) References Cited

U.S. PATENT DOCUMENTS

| | | | |
|---|---|---|---|
| 5,219,777 | * 6/1993 | Kang | 437/44 |
| 5,395,773 | 3/1995 | Ravindhran et al. | 437/27 |
| 5,489,543 | * 2/1996 | Hong | 437/41 |
| 5,534,449 | 7/1996 | Dennison et al. | 437/34 |
| 5,683,927 | 11/1997 | Dennison et al. | 437/57 |
| 5,759,901 | * 6/1998 | Loh et al. | 438/305 |
| 6,159,815 | * 12/2000 | Lustig et al. | 438/305 |
| 6,174,759 | * 1/2001 | Verhaar et al. | 438/201 |

* cited by examiner

Primary Examiner—Wael Fabmy Jr.
Assistant Examiner—Fernando Toledo
(74) Attorney, Agent, or Firm—Skjerven Morrill MacPherson LLP; David W. Heid

(57) ABSTRACT

The present invention provides a CMOS process, wherein a halo structure can be fabricated without employing an additional lithographic mask for protecting the transistors of the opposite conductivity during a halo implant. The halo implant has a projected range or depth that lies in the range of an LIP implant or a counter-doping implant in the well containing the transistors of the opposite conductivity. The LIP or counter-doping implant effectively cancels the halo impurities.

11 Claims, 8 Drawing Sheets

HALO STRUCTURE FOR CMOS TRANSISTORS AND METHOD OF MANUFACTURING THE SAME

FIELD OF THE INVENTION

The present invention relates generally to semiconductor devices and particularly to the manufacture of CMOS field-effect transistors (FETs) having halo structures.

DESCRIPTION OF THE INVENTION

As the minimum feature size in semiconductor integrated circuits shrinks, the distance between the source and drain regions becomes smaller. The reduced spacing between the source and drain regions for the field-effect transistors (FETs) results in short channel effects such as punch-through, reduced source-to-drain breakdown voltage, reduced threshold voltage ($V_T$), and increased sub-threshold swing. To relieve the short channel effects, the semiconductor industry is constantly optimizing the fabrication processes for MOSFET devices. Current trends in VLSI fabrication of CMOS devices are toward reducing the junction depth of the source/drain regions because shallow junctions reduce the encroachment of the source/drain depletion regions into the channel.

Another approach introduces a punch-through implant, which increases the concentration of channel type impurities beneath the channel where breakdown typically occurs. The punch-through implant is below the channel so that the active channel impurity concentration is substantially unaffected. The increased background impurity concentration effectively reduces the depletion zone width, thereby increasing the breakdown voltage.

Advances in semiconductor processing technology have now reduced channel lengths to well below 0.25 μm. At these sizes, any loss of effective channel length can be costly in terms of lowering the breakdown voltage of a transistor. Accordingly, limiting the lateral diffusion of the source/drain impurities is increasingly important.

A halo implant, also called a "pocket implant", can limit the lateral diffusion of the source and drain impurities. The halo implant implants impurities having a conductivity type opposite to that of the source and drain. Usually, the halo implant comes after defining the gate and before the source/drain diffusion. Due to the masking effect, the halo implant typically exhibits a peak impurity concentration near the source/drain regions. To impede vertical diffusion of source/drain impurities, the implant energy for the halo implant should be carefully chosen so that the halo depth away from the peak is greater than the depth of the source/drain implant.

U.S. Pat. Nos. 5,747,855 and 5,534,449 describe halo implant methods that form halo structures. CMOS processes usually perform the halo implants separately for the PMOS and NMOS devices. This is because the halo implant for the PMOS devices use N-type impurities such as phosphorus and arsenic, but the halo implant for the NMOS devices use the P-type impurities such as boron and $BF_2$. Accordingly, U.S. Pat. Nos. 5,747,855 and 5,534,449 employ an additional photolithography process to mask the PMOS devices during the halo implant for the NMOS devices. This additional masking step increases the complexity of the fabrication process and increases the cost of the fabricated semiconductor chips. If, however, the masking step is skipped and the halo implant for the NMOS transistor, for example, is performed simultaneously over the whole wafer, the halo implant destroys the optimization of the PMOS transistor.

Furthermore, if a cell transistor in a memory cell array is exposed to the boron halo implant for the NMOS devices, the leakage current and the junction capacitance of the cell transistor will tend to increase.

SUMMARY OF THE INVENTION

In accordance with an aspect of the present invention, a semiconductor device and a fabrication method thereof simplify application a halo implant to the CMOS process. The fabrication method applies a uniform halo implant to a CMOS structure without destroying the optimization of transistors or employing an additional photo-mask for the halo implant process. In particular, the halo implant applies to a CMOS process forming a DRAM memory without destroying the structure of the cell transistor in a DRAM memory cell.

In accordance with a broad aspect of the present invention, a semiconductor device fabrication process performs a halo implant with a projected range (e.g., depth and impurity concentration) within a projected range of a LIF or counter-doping implant defined during formation of a well of the opposite conductivity type. As a result, impurities in the well compensate for impurities from the halo implant, and a CMOS process can form a halo structure without requiring an additional lithographic masking process.

BRIEF DESCRIPTION OF THE DRAWINGS

Further features and aspects of the invention will become apparent from a description of the fabrication process and a structure resulting therefrom taken in conjunction with the accompanying drawings. The described embodiments of the invention, however, should not be taken to limit the invention but are for explanation and understanding only.

In the drawings.

DETAILED DESCRIPTION

Figure 1A:
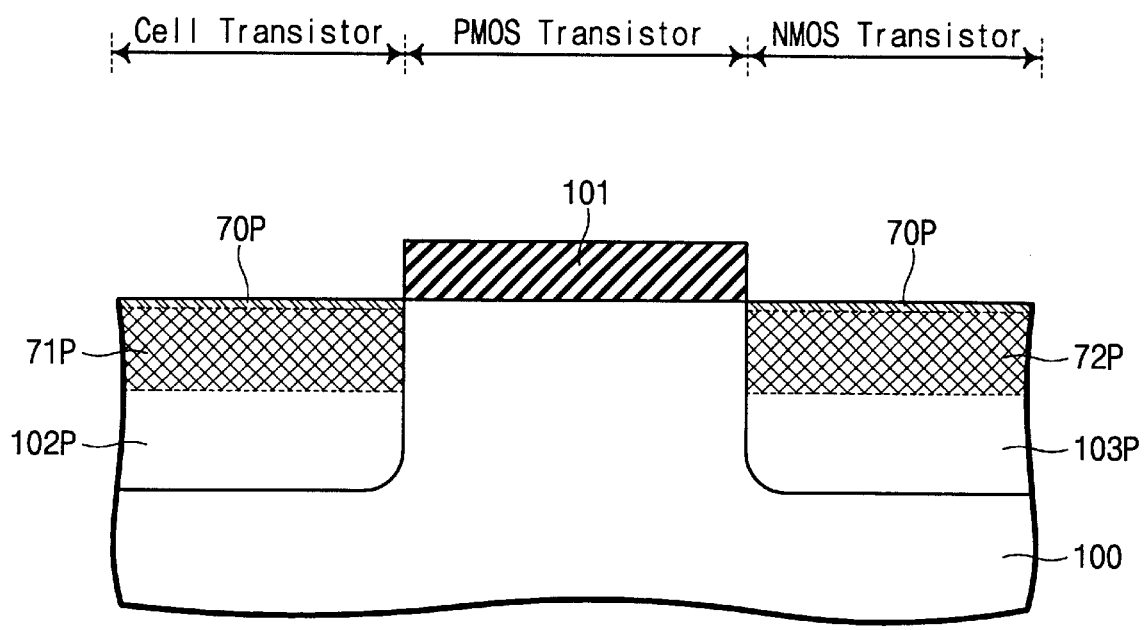
FIGS. 1A to 1E are cross-sectional views showing intermediate structures formed during fabrication of a semiconductor device in accordance with an embodiment of the present invention.

Embodiments of the present invention will be explained in detail with reference to the accompanying drawings. FIGS. 1A to 1E show cross sections of semiconductor structures formed during a fabrication process according to an embodiment of the present invention. In FIG. 1A, a conventional mask layer 101 is formed on a semiconductor substrate 100 to define the boundaries of P-wells 102P and 103P. Initially, ion implantation implants boron or another P-type impurity into the exposed surface of substrate 100 to create the doping profile 70P. Doping profile 70P is for control of the threshold voltages $V_T$ of NMOS transistors to be formed in the P-wells 102P and 103P. Thereafter, a punch-through implant creates profiles 71P and 72P, and a boron implantation completes P-wells 102P and 103P. In the embodiment of FIG. 1A, the P-well 102P will contain a cell transistor of a DRAM integrated circuit, and the P-well 103P will contain an NMOS transistor in the peripheral circuitry of the DRAM integrated circuit.

Figure 1B:
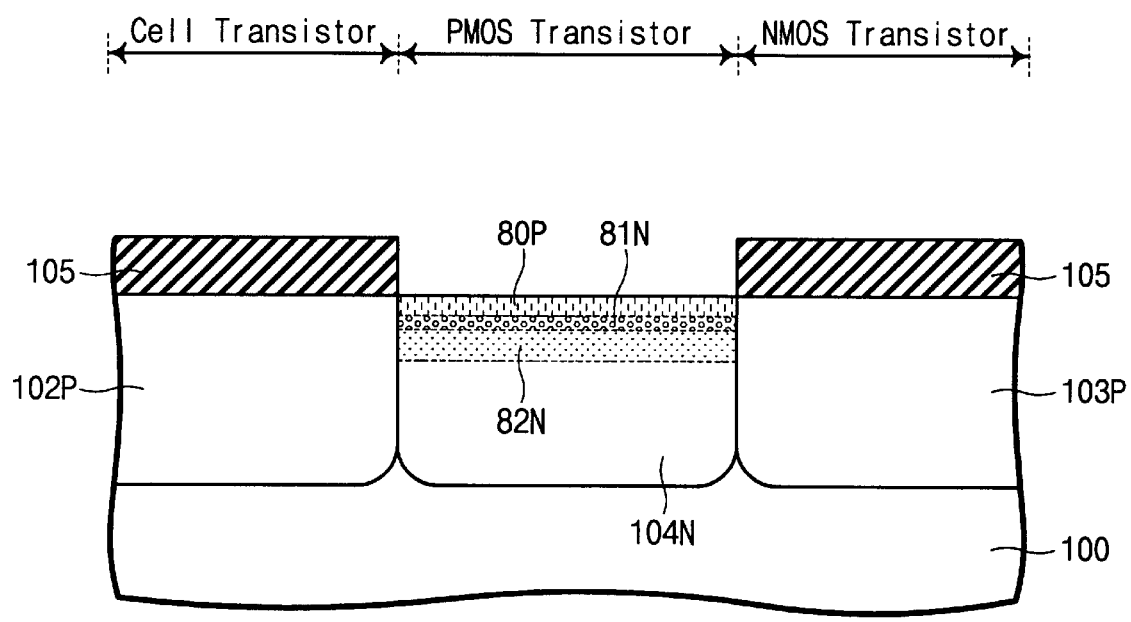

FIG. 1B shows the structure after removing mask layer 101 and forming a mask layer 105 to define boundaries of an N-well 104N between the P-wells 102P and 103P. To form the N-well 104N, a $V_T$ control implant (profile 80P), a counter doping implant (profile 81N), and LIF (local implantation of field oxide) implant (profile 82N) are successively performed. In an exemplary embodiment of the present invention, the $V_T$ control implant, which controls the threshold voltage $V_T$ of PMOS transistors, employs a P-type impurity such as $BF_2$. The LIF implant, which is for preventing punch-through, uses phosphorus with a dose between about $4\times10^{12}$ and about $1\times10^{13}$ cm$^{-2}$ and an implant energy between about 80 and about 120 KeV. The counter-doping implant uses arsenic atoms with a dose between about $2\times10^{12}$ and about $5\times10^{13}$ cm$^{-2}$ and an implant energy between about 120 and about 240 KeV.

Preferably, the projected range for the depth and concentration of the implanted ions during the LIF implant and/or the counter-doping implant contains or almost coincides with the projected range of a boron halo implant, which the subsequent processing performs. Thereby, the PMOS transistors avoid short-channel effects even if the boron atoms for the halo structure of the NMOS devices are implanted over the surface N-well 104N.

Figure 1C:
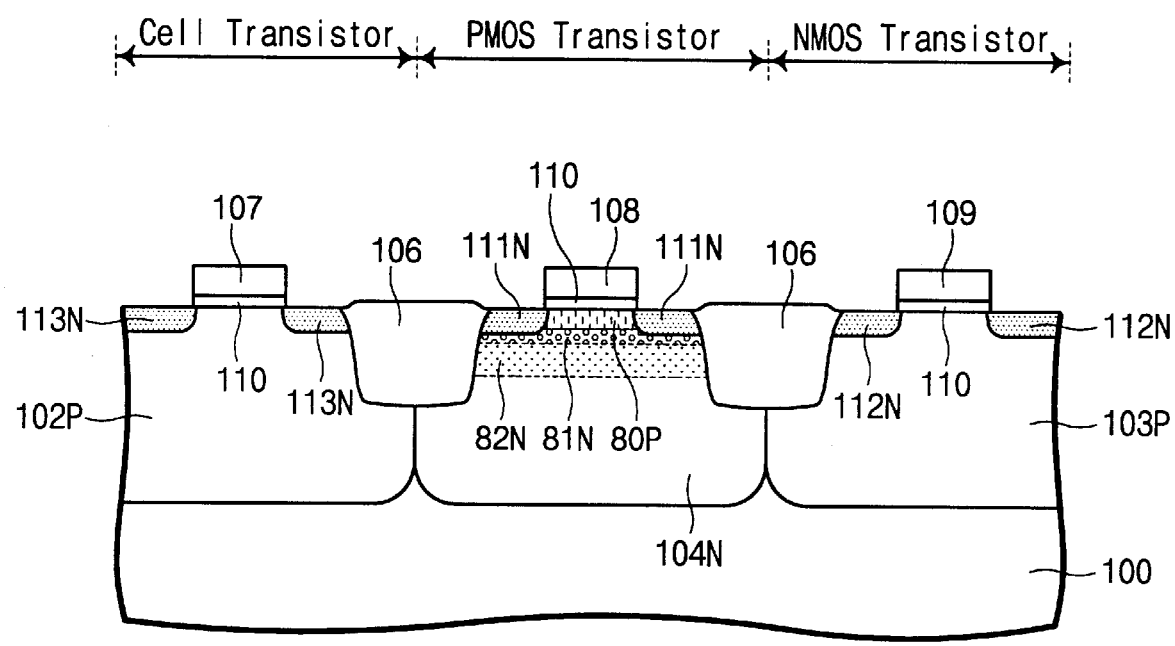

FIG. 1C shows the structure after formation of device isolation 106, a gate oxide 110, and polysilicon gates 107, 108, and 109. Polysilicon gates 107 and 109 are gates of NMOS transistors, and polysilicon gate 108 is the gate of a PMOS transistor. An N-type implant with a light dose can be self-aligned with the polysilicon gates 107, 108, and 109 to create diffusion regions 111N, 112N, and 113N. Region 111N has an effective impurity concentration greater than that of regions 112N and 113N because the N-type impurities from the light implant add to the N-type impurities already in N-well 104N. In the exemplary embodiment of the present invention, the implant for diffusion layers 111N, 112N, and 113N uses phosphorus atoms with a dose between about $1\times10^{13}$ and about $5\times10^{13}$ cm$^{-2}$ and an energy between about 20 and about 40 KeV.

The lightly-doped diffusion layer 113N in the P-well 102P acts as the source and drain of the NMOS cell transistor, while the lightly-doped diffusion layer 112N in the P-well 103P act as a lightly-doped drain (LDD) for the peripheral NMOS transistor. The lightly-doped diffusion layer 111N in the N-well 104N acts as a halo structure for strengthening the performance of the PMOS transistor in the N-well 104N.

Figure 1D:
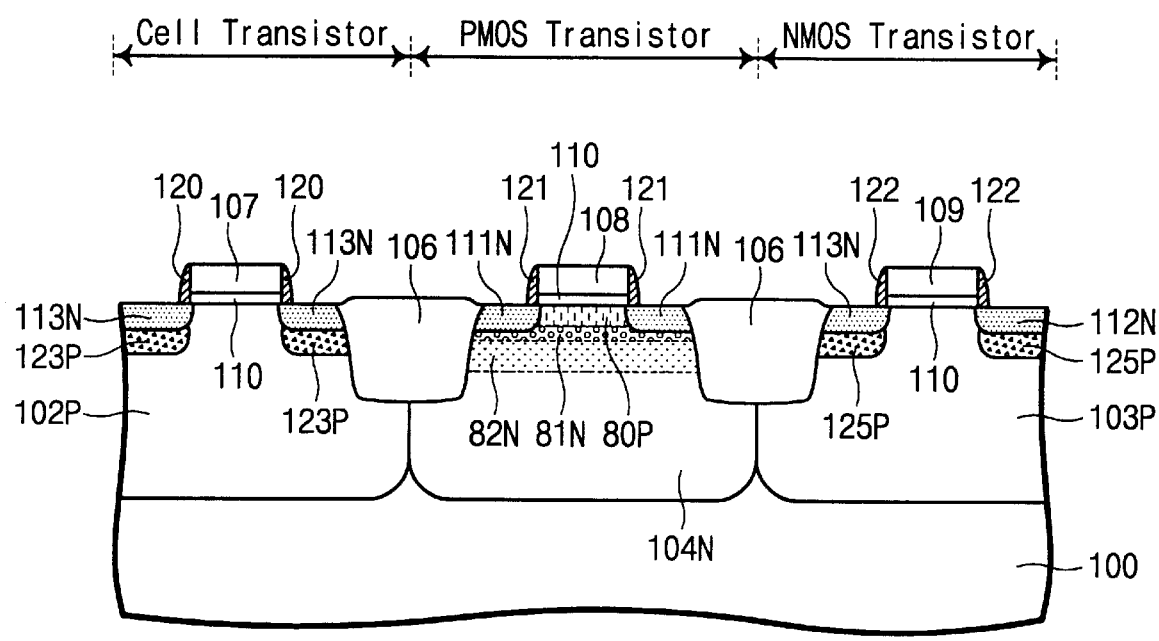

FIG. 1D shows the structure after formation of first gate spacers 120, 121, and 122 on the sidewalls of the polysilicon gates 107, 108, and 109. Anisotropic etching of insulating films deposited over the gate structures can form first gate spacers 120, 121, and 122. The first gate spacers 120, 121, and 122 serve to limit the lateral diffusion of halo ions in the PMOS transistor during a maskless halo implantation for the NMOS transistors. Preferably, the size of the first gate spacer is optimized to achieve the desired breakdown voltage (BVDS) of the PMOS transistor. The exemplary embodiment of the present invention forms the first gate spacers 120, 121, and 122 from a silicon oxide layer having a thickness between about 100 and about 300 Å.

After formation of the gate spacers 120, 121, and 122, the fabrication process performs a blanket halo implant over the structure. The halo implant employs the gates 107, 108, and 109 and the first gate spacers 120, 121, and 122 as a doping mask in a self-aligned process for diffusion into substrate 100. In the exemplary embodiment, the halo implant uses boron atoms with a dose between about $1\times10^{12}$ and about $1\times10^{13}$ cm$^{-2}$ and an energy between about 20 and about 60 KeV. A unique feature of the present invention is that the halo implant does not require any additional masking steps for the protection of the transistors of the opposite conductivity.

Figure 1E:
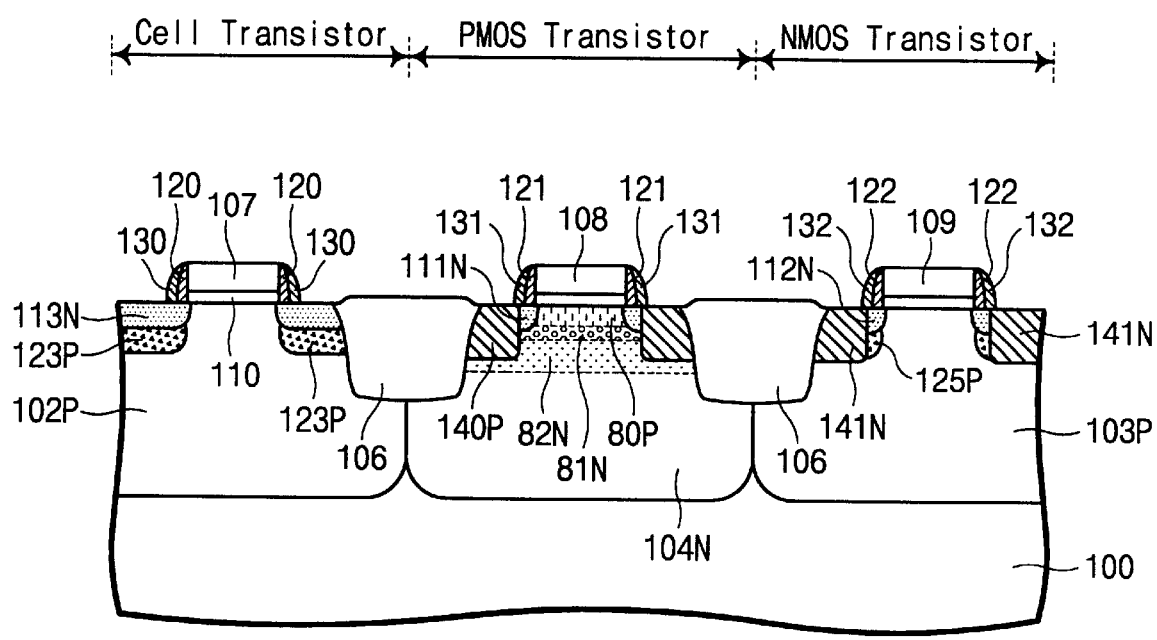

FIG. 1E shows the structure after formation of second gate spacers 130, 131, and 132. Conventional anisotropic etching of conformal insulating films on the structure can form the second gate spacers 130, 131, and 132. In the exemplary embodiment of the present invention, the second gate spacers 130, 131, and 132 are on the sidewalls of the first gate spacers 120, 121, and 122 and contain an insulating material such as silicon oxide or silicon nitride.

The exemplary embodiment forms gate spacers 130, 131, and 132 from an insulating film having a thickness between about 200 and about 500 Å. Thereafter, heavily-doped source and drain regions 141N and 140P can be formed for the NMOS and PMOS transistors, respectively, by implanting impurities in a self-aligned manner to the polysilicon gates, and the first and second gate spacers. A mask layer on the surface of the cell transistor region can protect the cell transistor (in P-well 102P) from the heavy source/drain implants.

Referring again to FIG. 1E, the N$^+$ source/drain regions 141N are self-aligned to the second gate spacer 132 in the P-well 103P. Further, a P-type halo structure 125P is toward the channel near the N$^+$ source/drain regions 141N. Additionally, a lightly-doped drain 112N remains under spacers 122 and 132.

The P-type heavily-doped source/drain 140P is in the N-well 104N and self-aligned to the second gate spacer 131. The N-type halo structure 111N is toward the channel near the heavily-doped source/drain regions 140P. The boron profile generated for the halo structure of the NMOS transistor is not conspicuous in the N-well 104N because the N-type counter-doping profile 81N or the LIF implant profile 82N compensate for the P-type halo implant in the N-well 104N. More specifically the net effective impurity concentration remains N-type in N-well 104 even after the P-type halo implant.

A mask protects the cell transistor in the P-well 102P during the heavy N-type and P-type implants for source and drain regions in wells 103P and 104N. Thereafter, a low dose implant forms the lightly-doped source and drain regions 113N with a halo structure 123P remaining below.

As noted above, forming a halo structure in a CMOS process according to the described embodiment of the present invention does not require any additional masking steps for protecting transistors during the halo implants. The process avoids the problem of destroying the transistor structure during maskless halo implant by compensating for the halo profile either through the arsenic counter-doping profile or the LIP punch-through implant profile.

Figure 2:
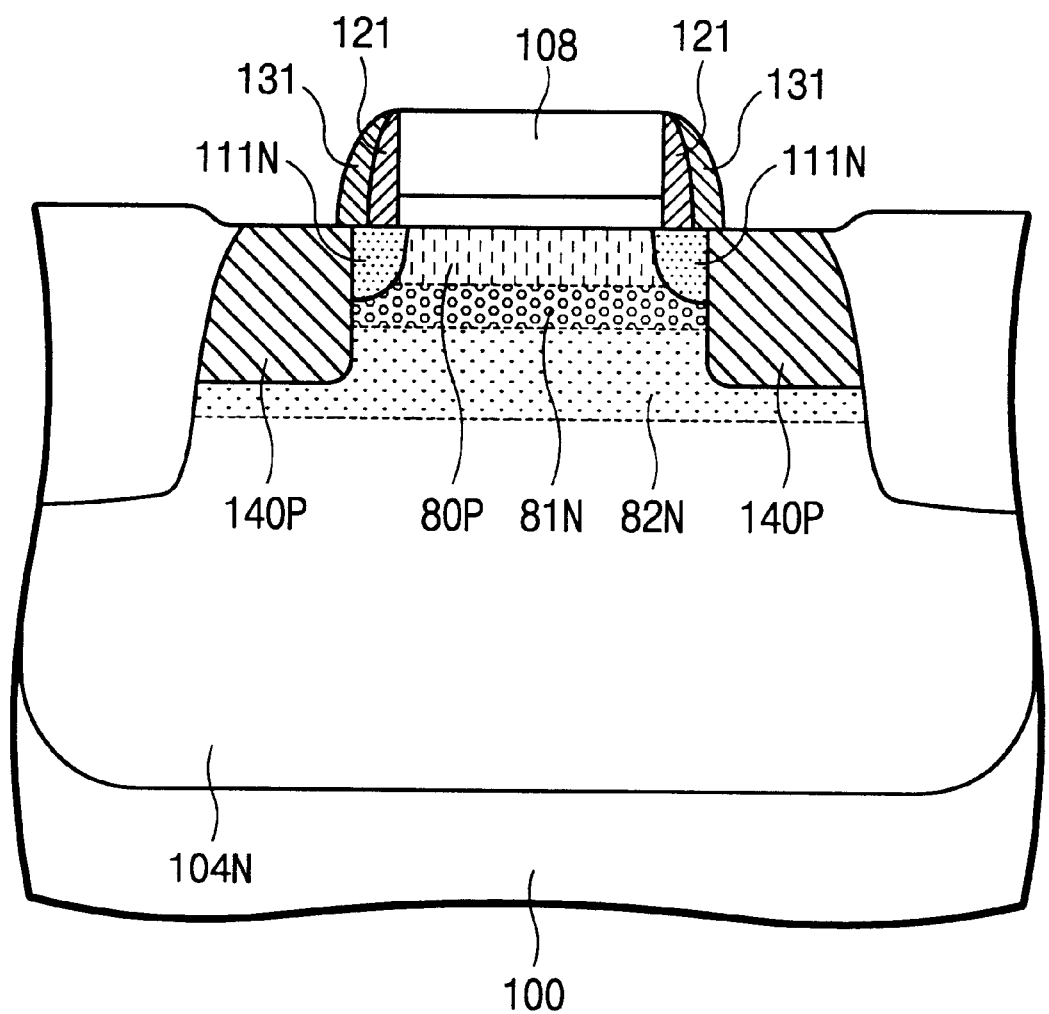
FIG. 2 is a cross-sectional view illustrating a PMOS transistor in accordance with an embodiment of present invention.

FIG. 2 is a schematic cross-sectional view illustrating a PMOS transistor in accordance with an exemplary embodiment of present invention. In FIG. 2, a boron-doped region 80P for the $V_T$ control, an arsenic counter-doping profile 81N, and a phosphorus LIF profile 82N are in the N-well 104N. Furthermore, gate spacers 121 and 131 are on the sidewalls of the polysilicon gate 108, and the N-type halo structure 111N underlies spacers 121 and 131.

In the embodiment of the present invention, the projected ranges for the depth and impurity concentrations of the counter-doping layer 81N and the LIF implanted layer 82N can be adjusted so that they almost coincide with the projected range of the halo implant. This resolves the deterioration of performance the PMOS transistor even if an additional masking step is not employed to protect the PMOS transistors from the halo implant for the NMOS transistors. As a result, a P-type (boron) halo profile underneath the N-type halo structure 111N is not shown in FIG. 2 because the arsenic profile 81N and the punch-through implant profile 82N compensate for the boron halo implant. The arsenic counter-doping profile 81N and the LIF profile 82N are still shown in FIG. 3 because the boron halo implants compensates for profiles 81N and 82N only outside the channel regions.

Figure 3:
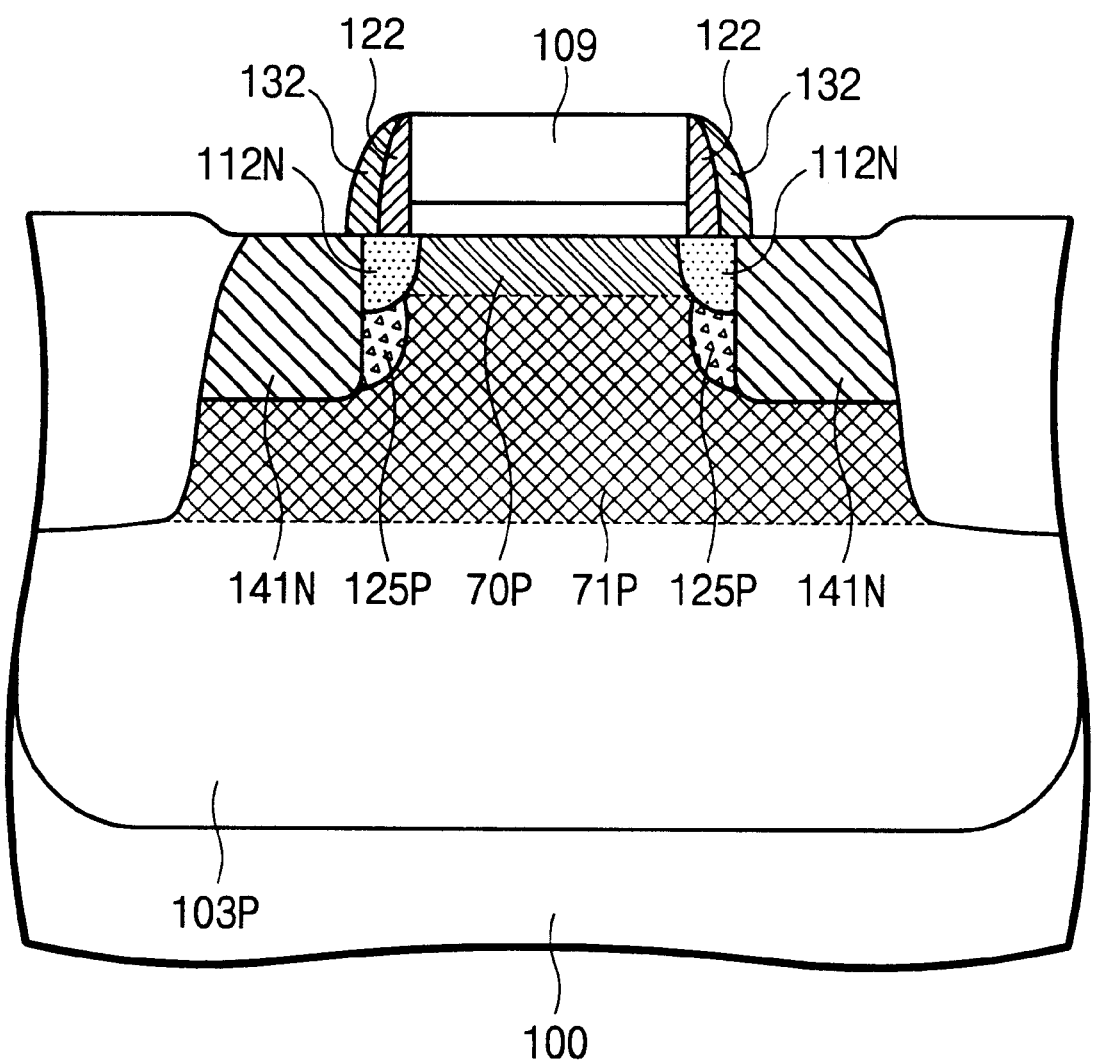
FIG. 3 is a cross-sectional view illustrating an NMOS transistor in accordance with an embodiment of the present invention.

FIG. 3 is a schematic cross-sectional view illustrating an NMOS transistor in accordance with an exemplary embodiment of the present invention. In FIG. 3, the NMOS transistor is in the P-well 103P. The NMOS transistor includes a lightly-doped drain 112N, a heavily-doped drain 141N, and a halo structure 125P.

Figure 4:
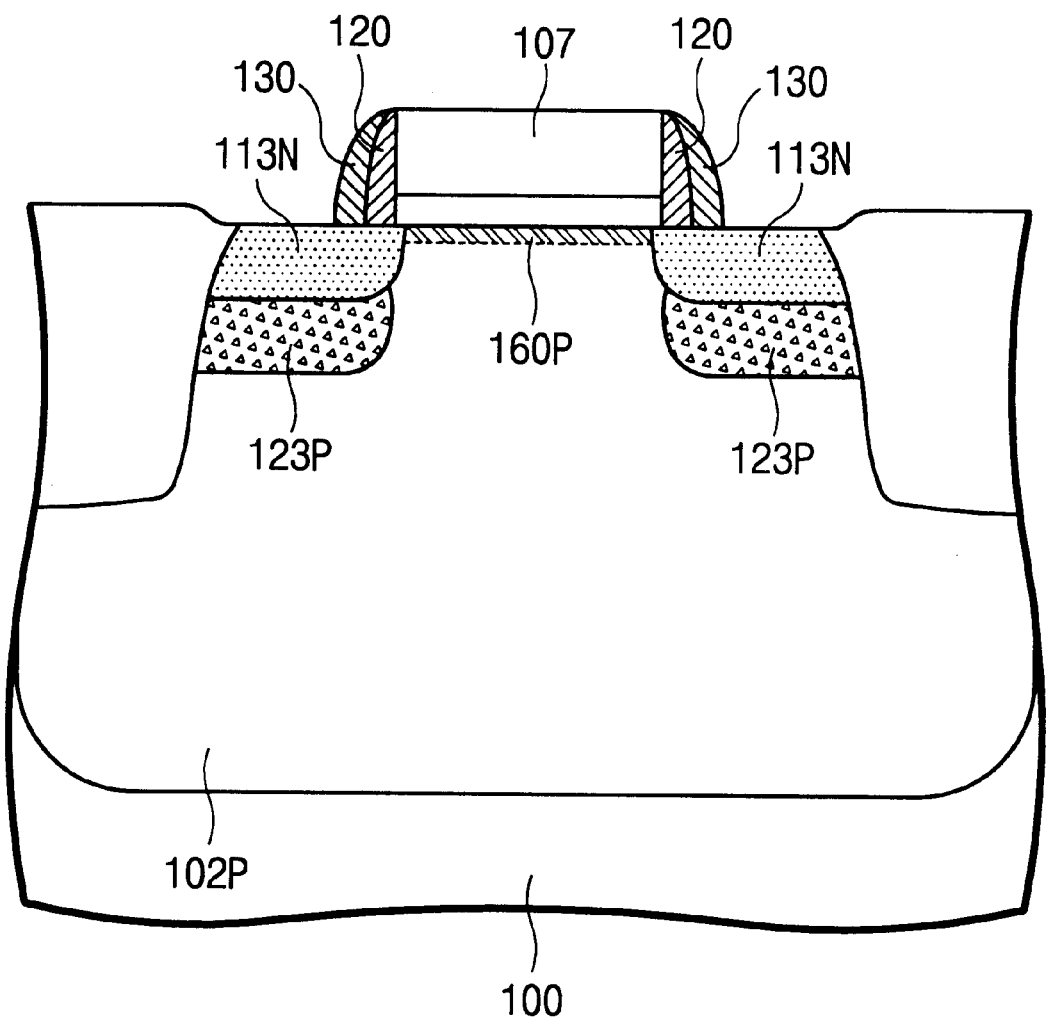
FIG. 4 is a cross-sectional view illustrating a cell transistor in accordance with an embodiment of the present invention.

FIG. 4 is a schematic cross-sectional view illustrating a cell transistor in accordance with an exemplary embodiment of the present invention. In FIG. 4, the cell transistor includes a lightly-doped drain 113N, a halo structure 123P, and a first and a second gate spacers 120 and 130. In one embodiment of the present invention, the LIF implant step is skipped to alleviate the leakage current and to reduce the junction capacitance of the cell transistor. Furthermore, hen the threshold voltage of the cell transistor increases due to the boron halo implant, the dose of $BF_2$ or boron can be adjusted in the $V_T$ control implant.

Although the invention has been illustrated and described with respect to exemplary embodiments thereof, various other changes, omissions and additions may be made therein and thereto, without departing from the spirit and scope of the present invention. Therefore, the present invention is not limited to the specific embodiment set forth above but includes all possible embodiments within the scope set forth in the appended claims.

What is claimed is:

1. A method for manufacturing a CMOS integrated circuit that includes a first transistor of a first conductivity in a first well having a second conductivity and a second transistor of said second conductivity in a second well having said first conductivity, said transistors having halo structure, said method comprising:

performing a punch-through implant of a second conductivity in said first well;

forming a gate for said first and second transistors;

performing a halo implant of said first conductivity into said first and second wells, wherein a first projected range of said punch-through implant overlaps a second projected range of said halo implant.

2. The method as set forth in claim 1, wherein performing said punch-through implant further comprises performing a counter-doping implant of said second conductivity, with a projected range in said range of said halo implant.

3. The method as set forth in claim 2, wherein performing said counter-doping implant comprises implanting arsenic with a dose between $2 \times 10^{12}$ and $5 \times 10^{13}$ cm$^{-2}$ and an energy between 120 and 240 KeV.

4. The method as set forth in claim 1, wherein after performing said halo implant of said first conductivity, the method further comprises:

forming a first gate spacer on sidewalls of said gate;

forming a second gate spacer for said first transistor; and implanting impurities of said first conductivity with a second doping concentration in a self-aligned fashion to said gate, said first gate spacer, and said second gate spacer.

5. The method as set forth in claim 4, wherein forming said second gate spacer comprises:

forming a silicon nitride layer with a thickness between 200 and 500 Å over said gate and said first gate spacer; and anisotropically etching said insulating layer to leave said second gate spacer on said sidewalls of said first gate spacer.

6. The method as set forth in claim 1, wherein performing said punch-through implant comprises implanting phosphorus with a does between $4 \times 10^{12}$ and $1 \times 10^{13}$ cm$^{-2}$ and an energy between 120 and 240 KeV.

7. The method as set forth in claim 1, wherein performing said halo implant comprises implanting boron with a dose between $1 \times 10^{12}$ and $1 \times 10^{13}$ cm$^{-3}$ and an energy between 20 and 60 KeV.

8. The method as set forth in claim 1, wherein performing said halo implant comprises implanting impurities of said first conductivity, whose projected range lies under said diffusion layer.

9. The method as set forth in claim 4, wherein forming said first gate spacer comprises:

forming an insulating layer with a thickness between 100 and 300 Å; and anisotropically etching said insulating layer to leave said first gate spacer on said sidewalls of said gate.

10. The method as set forth in claim 9, wherein forming said insulating layer comprises forming a silicon nitride layer.

11. The method as set forth in claim 1, wherein impurities from said halo implant control the threshold voltage of said second transistor.

* * * * *